(12) United States Patent  (10) Patent No.: US 6,201,738 B1
Hebishima  (45) Date of Patent: Mar. 13, 2001

(54) NONVOLATILE SEMICONDUCTOR MEMORY AND PROGRAM VERIFICATION METHOD IN WHICH NUMBER OF WRITE OPERATION CAN BE REDUCED IN PROGRAM VERIFICATION OPERATION

(75) Inventor: Hirofumi Hebishima, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/352,397

(22) Filed: Jul. 13, 1999

(30) Foreign Application Priority Data

Jul. 24, 1998 (JP) .................................... 10-209094

(51) Int. Cl.$^7$ .................................................. G11C 16/06
(52) U.S. Cl. .................................. 365/185.21; 365/185.22
(58) Field of Search ........................... 365/185.21, 185.22

(56) References Cited

U.S. PATENT DOCUMENTS 5,574,684 * 11/1996 Tomoeda ........................... 365/185.22
5,602,789 * 2/1997 Endoh et al. ..................... 365/185.22
5,886,927 * 3/1999 Takeuchi ........................... 365/185.22
5,999,446 * 12/1999 Harari et al. ..................... 365/185.22

FOREIGN PATENT DOCUMENTS 5-144277   6/1993 (JP) .............................. G11C/16/06

* cited by examiner

*Primary Examiner*—Trong Phan
(74) *Attorney, Agent, or Firm*—Hayes, Soloway, Hennessey, Grossman & Hage, P.C.

(57) ABSTRACT

A nonvolatile semiconductor memory includes a memory cell array, a comparing section, and a plurality of write circuits. The memory cell array includes a plurality of nonvolatile memory cells. The comparing section compares a read out data including a plurality of first bit data read out from the memory cell array with an expectation value data including a plurality of second bit data in units of bits, to output a judgment signal indicative of the comparison results. The plurality of write circuits writes each of the plurality of second bit data to a part of the memory cell array. The plurality of write circuits are selectively made active. A number of the write circuits to be selectively made active is variable based on the judgment signal.

22 Claims, 14 Drawing Sheets

Fig. 3 PRIOR ART
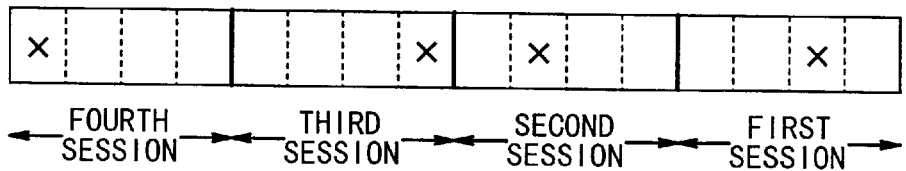
X DENOTES FAIL.
Fig. 4
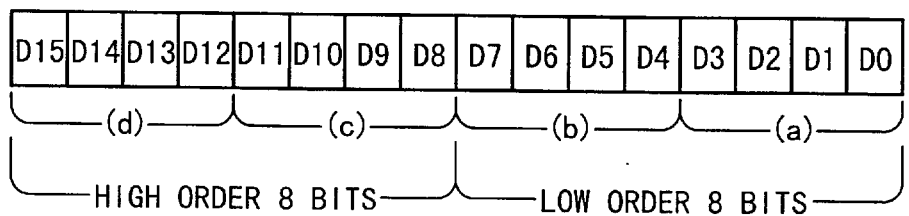
Fig. 5
| | CONDITION FOR EACH OF THE FLAGS TO BE "H" |
|---|---|
| F0 | 5 BIT OR MORE OF ALL THE 16 BITS ARE IN THE FAIL |
| F1 | 5 BIT OR MORE OF THE HIGH ORDER 8 BITS ARE IN THE FAIL |
| F2 | 5 BIT OR MORE OF THE LOW ORDER 8 BITS ARE IN THE FAIL |
| BFUB | THE FAIL IS NOT PRESENT IN THE HIGH ORDER 8 BITS |
| BFLB | THE FAIL IS NOT PRESENT IN THE LOW ORDER 8 BITS |

Fig. 8

| NUMBER | | STATE OF FLAG | | | | | WRITE PROCEDURE | | | | NUMBER OF WRITE OPERATION DIVIDED |
|---|---|---|---|---|---|---|---|---|---|---|---|
| | | F0 | F1 | F2 | BFUB | BFLB | FIRST SESSION | SECOND SESSION | THIRD SESSION | FOURTH SESSION | |
| (A) | | H | H | H | * | * | (a) | (b) | (c) | (d) | 4 |
| (B) | (B1) | H | L | H | L | L | (a) | (b) | (cd) | | 3 |
| | (B2) | H | H | L | H | L | (a) | (b) | | | 2 |
| (C) | (C1) | H | L | L | L | L | (ab) | (c) | (d) | | 3 |
| | (C2) | H | L | L | L | H | (c) | (d) | | | 2 |
| (D) | | H | L | L | * | * | (ab) | (cd) | | | 2 |
| (E) | | L | L | L | * | * | (abcd) | | | | 1 |

* DENOTES H OR L.

| Fig. 14(A) | Fig. 14(B) |

NONVOLATILE SEMICONDUCTOR MEMORY AND PROGRAM VERIFICATION METHOD IN WHICH NUMBER OF WRITE OPERATION CAN BE REDUCED IN PROGRAM VERIFICATION OPERATION

BACKGROUND OF THE INVENTION

1. Field of the Invention

The present invention relates to a nonvolatile semiconductor memory in which an electrical write and erase operation can be performed and a program verification method of a nonvolatile semiconductor memory. More particularly, the present invention relates to a nonvolatile semiconductor memory and a program verification method in which a program verification operation can be effectively performed.

2. Description of the Related Art

In a nonvolatile semiconductor memory such as an $E^2$ PROM, and a flash memory, in which an electric write and erase operation can be performed, it is necessary to check whether or not a write and erase operation of data is actually performed after the write and erase operation of data. This checking operation is referred to as a verification. Then, a verification performed when the data is written is referred to as a program verification, and a verification performed when the data is erased is referred to as an erasable verification.

A conventional nonvolatile semiconductor memory will be described below with reference to FIG. 1. As shown in FIG. 1, the nonvolatile semiconductor memory is provided with a memory cell array 1, an address buffer 2, a row decoder 3, a column decoder 4, a sense amplifier 5, an input and output buffer 6, a comparison circuit block 7, a write circuit block 8 and a control circuit 9.

In the memory cell array 1, memory cells are arranged in a form of array. The address buffer 2 latches an address signal sent from an external portion to output to the row decoder 3 and the column decoder 4. The row decoder 3 decodes a low address signal from the address signal sent from the external portion to select a word line. The column decoder 4 decodes a column address signal from the address signal sent from the external portion to select a data line.

The sense amplifier 5 amplifies the data read out through the data line from the memory cell array 1. The input and output buffer 6 inputs a signal from a data bus 6a and outputs a signal to the data bus 6a.

The comparison circuit block 7 compares a signal (read out data), in which the data stored in the memory cell array 1 is amplified by the sense amplifier 5, with a signal in which the data (expectation value data) sent from the data bus 6a is amplified by the input and output buffer 6.

The write circuit block 8 writes the data to the memory cell array 1, if the signal outputted by the sense amplifier 5 does not coincide with the output signal from the input and output buffer 6, as the comparison result in the comparison circuit block 7.

The control circuit 9 controls the sense amplifier 5, the input and output buffer 6, the comparison circuit block 7, the write circuit block 8 and the like.

The operation of the program verification in the nonvolatile semiconductor memory shown in FIG. 1 will be described below with reference to a flowchart shown in FIG. 2.

At first, the write operation is started at a step S0. Next, at a step S1, the number of times (number of write times) is counted in which the write circuits of the write circuit block 8 have already written data to the memory cells of the memory cell array 1.

For example, if a length of data is 16 bits, and an inner bus has 16 bits wide, there are 16 write circuits of the write circuit block 8. Those 16 write circuits respectively perform the write operations on the 16 memory cells. The control circuit 9 counts the number of write operations in each write circuit.

Next, at a step S2, it is judged whether or not the number of write operations counted at the step S1 reaches a predetermined maximum value. If it reaches the maximum value, an abnormal end is performed at a step S4. That is, the write operation is performed by implanting a hot electron into a floating gate of the nonvolatile semiconductor memory to change a threshold value of a transistor of the memory cell. In this case, even if the hot electron is implanted into the floating gate for a predetermined number of times, it is abnormal unless the threshold value of the transistor reaches the predetermined value. Hence, this case is treated as a defect.

Next, the program verification is performed at a step S3, if it is judged at the step S2 that the number of write operations does not reach the maximum value. That is, the comparison circuit block 7 compares the read out data with the expectation value data which should be written to the memory cell. The comparison circuit block 7 judges that the write operation has been normally completed if both of them coincide with each other (pass) as the compared result. Then, a write completion is established at a step S5.

If both of them do not coincide with each other (fail) as the compared result, the expectation value data is written to the memory cell array 1 by using the write circuits of the write circuit block 8 at a step S6. At this time, a power supply for the 16 write circuits of the write circuit block 8 has a high voltage, and a current in the write operation is large. Accordingly, the current in the write operation may cause noise or heat to be induced. Also, there is the restriction on the current drive ability of an inner power supply. Thus, the 16 write circuits can not write the data to the memory cells at the same time. Hence, the write operation is actually performed by dividing into four sessions for each four bits (predetermined value).

Next, the number of write operations is counted at the step S1, and the processes on and after the step S2 are similarly repeated.

For example, as shown in FIG. 3, the conventional nonvolatile semiconductor memory has the following problem, if there are only four bits judged as the fail at the step 53 of FIG. 2, of the 16 bits. That is, the number (four) of fails is equal to or less than the predetermined value. Therefore, the four bits for the fail can be written all at once even if the restriction on the drive ability of the inner power supply and the erroneous operation resulting from the noise occurrence when the write current flows are considered. Although it, the write operation must be performed by dividing into the four sessions. This results in a problem that a useless write cycle is induced to thereby make a write process time longer.

A technique disclosed in Japanese Laid Open Patent Application (JP-A-Heisei 5-144277) is well known for the nonvolatile semiconductor memory. A CMOS flip-flop serving as a data latch and a sense amplifier is provided at one end of a bit line direction of a memory cell array. So, this technique has a verification control means for setting a unit write time for a memory cell in a predetermined range of the memory cell array, and simultaneously writing data, and then performing a re-write operation if there is a memory cell in an insufficiently written state after the data in the memory cell is read out. When a write verification operation is performed, a logical operation is performed between the exteriorly read out data in the memory cell and the write data latched in the flip-flop. Then, the re-write data is automatically set for each bit so that an unnecessary write operation is not performed.

SUMMARY OF THE INVENTION

The present invention has been made to solve the above-described problems of the conventional nonvolatile semiconductor memory and a program verification method. An object of the present invention is to provide a nonvolatile semiconductor memory and a program verification method in which the number of write operation can be reduced in program verification operation.

Therefore, an object of the present invention is to provide a nonvolatile semiconductor memory and a program verification method, in which an unnecessary write cycle can be removed and thereby a write time can be made shorter.

In order to achieve an aspect of the present invention, a nonvolatile semiconductor memory includes a memory cell array including a plurality of nonvolatile memory cells, a comparing section comparing a read out data including a plurality of first bit data read out from the memory cell array with an expectation value data including a plurality of second bit data in units of bits, to output a judgment signal indicative of the comparison results and a plurality of write circuits writing each of the plurality of second bit data to a part of the memory cell array, wherein the plurality of write circuits are selectively made active, and a number of the write circuits to be selectively made active is variable based on the judgment signal.

In order to achieve another aspect of the present invention, a nonvolatile semiconductor memory includes a memory cell array including a plurality of nonvolatile memory cells, a comparing section comparing a read out data including a plurality of first bit data read out from the memory cell array with an expectation value data including a plurality of second bit data in units of bits, to output a judgment signal indicative of the comparison results, a plurality of write circuits respectively provided for the plurality of first bit data and writing each of the plurality of second bit data to a part of the memory cell array, in response to a control signal and the judgment signal and a control section outputting the control signal to each of the plurality of write circuits, in response to the judgment signal.

In this case, the control section outputs the control signal to ones selected from the plurality of write circuits at timings identical to each other, as selected circuits, and determines a number of the selected circuits based on the judgment signal.

Also in this case, the control section determines the number of the selected circuits such that the number is equal to or less than a predetermined value.

Further in this case, the plurality of write circuits are classified into a plurality of groups, and the control section outputs the control signal to the write circuits belonging to each of the plurality of groups at timings identical to each other, and determines the number of selected circuits with each of the plurality of groups as a unit.

In this case, the plurality of write circuits are classified into the plurality of groups, based on an array order of the plurality of first bit data in the read out data, and the control section detects, as fail data, the first bit data which do not coincide with the second bit data based on the judgment signal, and detects, as a second detection result, a distribution of the fail data in the read out data, to determine the number of selected circuits based on the second detection result.

Also in this case, the control section generates a plurality of flag signals to indicate the second detection result, and determines the number of selected circuits based on the plurality of generated flag signals.

Further in this case, the control section generates a plurality of flag signals to indicate the second detection result, and the plurality of flag signals includes a first flag signal whose signal level changes from a first level to a second level, when a number of the fail data exceeds a predetermined value, the fail data being included in all of the first bit data in the read out data, a second flag signal whose signal level changes from a first level to a second level, when the number of fail data exceeds the predetermined value, the fail data being included in a first portion of all of the first bit data in the read out data, a third flag signal whose signal level changes from a first level to a second level, when the number of fail data exceeds the predetermined value, the fail data being included in a second portion other than the first portion of all of the first bit data in the read out data, a fourth flag signal whose signal level changes from a first level to a second level, when the number of fail data is zero, the fail data being included in the first portion of all of the first bit data in the read out data and a fifth flag signal whose signal level changes from a first level to a second level, when the number of fail data is zero, the fail data being included in the second portion of all of the first bit data in the read out data.

In this case, the control section outputs the control signal to each of the plurality of groups at timings different from each other, when all of the first to third flag signals are in the second level, and outputs the control signal to each of the plurality of groups at timings identical to each other, when all of the first to third flag signals are in the first level, and does not output the control signal to each of ones of the plurality of groups corresponding to the first portion, when the fourth flag signal is in the second level and does not output the control signal to each of ones of the plurality of groups corresponding to the second portion, when the fifth flag signal is in the second level.

Also in this case, the control section determines a timing when outputting the control signal to each of the plurality of groups, based on the determined number of selected circuits.

Further in this case, a single write operation when the plurality of second bit data are written to the part of the memory cell array includes one cycle or a plurality of cycles, and the control section determines a number of the cycles in the single write operation, based on the determined number of selected circuits.

In order to achieve still another aspect of the present invention, a program verification method of a nonvolatile semiconductor memory includes (a) reading out first bit data from each of a plurality of nonvolatile memory cells, (b) providing second bit data to be written to each of the plurality of memory cells, (c) judging whether or not each of a plurality of the first bit data coincides with the second bit data to generate a judged result, (d) detecting, as fail data, the first bit data which does not coincide with the second bit data, based on the judged result to generate a detected result, (e) writing, as at least a part of a write operation, the second bit data to each of the plurality of memory cells based on the detected result, wherein the write operation is performed with one cycle or a plurality of cycles and (f) determining a number of the cycles included in the write operation when the (e) step is performed, based on the detected result.

In this case, the (a) step includes reading out the first bit data from each of the plurality of memory cells to form a read out data of N (N is a positive integer) bits and the (f) step includes detecting a distribution of the fail data in the read out data as a second detected result based on the detected result to determine the number of cycles based on the second detected result.

Also in this case, the program verification method further includes (g) setting as M (M is a positive integer) a number of the second bit data which can be written in the one cycle when the write operation of the (e) step is performed, wherein the (a) step includes reading out the first bit data from the each memory cell to form a read out data of N (N is a positive integer) bits, and wherein the (f) step further includes (h) judging whether or not a number of the fail data exceeds (the M+1), of all of the read out data of the N bits, based on the detected result, and wherein the (f) step includes determining the number of cycles to be one, when the number of fail data does not exceed the (M+1), as the judged result of the (h) step.

Further in this case, the (f) step further includes (i) setting at least two judgment portions, in which each portion corresponds to P the first bit data to the read out data, wherein the P is equal to two times the M and (j) judging whether or not there are the fail data of the (M+1) or more in each of first and second the judgment portions, based on the detected result, and wherein the (f) step includes determining the number of cycles to be two, when it is judged that there are the fail data of the (M+1) or more, as the judged result of the (h) step, and when it is judged that there are not the fail data of the (M+1) or more in both of the first and second judgment portions, as the judged result of the (j) step.

In this case, the (f) step further includes (k) judging whether or not the fail data in each of the first and second judgment portions is zero, based on the detected result, and wherein the (f) step includes determining the number of cycles to be two, when it is judged that there are the fail data of the (M+1) or more in the first judgment portion, as the judged result of the (j) step, and when it is judged that the fail data in the second judgment portion is zero, as the judged result of the (k) step, and determining the number of cycles to be three, when it is judged that there are the fail data of the (M+1) or more in the first judgment portion and there are not the fail data of the (M+1) or more in the second judgment portion, as the judged result of the (j) step, and when it is judged that the fail data in the second judgment portion is not zero, as the judged result of the (k) step.

Also in this case, the (e) step includes writing the second bit data to each of the plurality of memory cells corresponding to the detected fail data.

Further in this case, the (a) step includes reading out the first bit data from the each memory cell to form a read out data of N (N is a positive integer) bits, and wherein the program verification method further includes (1) setting as M (M is a positive integer) a number of the second bit data which can be written in the one cycle when the write operation of the (e) step is performed, and (m) providing a plurality of write sections, wherein a number of the plurality of write sections is the N, and each of the N write sections writes the second bit data to the each memory cell, and wherein the (m) step includes providing the N write sections such that the N write sections are classified into a plurality of groups, each of the plurality of groups being allocated to the M write sections, and wherein the program verification method further includes (n) inputting a first control signal for determining a write timing to each of the M write sections allocated to a first one of the plurality of groups, wherein the first control signal is common in the M write sections of the first group.

In this case, the program verification method further includes (o) inputting a judgment signal indicating that the each memory cell corresponding to each of the M write sections of the first group has the fail data, in addition to the first control signal, to the each write section of the first group, and wherein the each write section of the first group writes the second bit data, in response to the first control signal and the judgment signal.

Also in this case, the program verification method further includes (p) inputting a second control signal for determining a write timing to each of the M write sections of a second one of the plurality of groups, wherein the second control signal is common in the M write sections of the second group, and wherein the (p) step includes inputting the second control signal to the each write section of the second group at one of a timing identical to the first control signal and a timing different from the first control signal, based on the detected result.

Further in this case, the program verification method further includes (q) determining whether or not a second control signal common in a second one of the plurality of groups is inputted to each of the M write sections of the second group, based on the detected result.

In order to achieve yet still another aspect of the present invention, a program verification method of a nonvolatile semiconductor memory includes (a) providing a memory cell array including a plurality of nonvolatile memory cells, (b) reading out a read out data including first bit data of N (N is a positive integer) bits from the memory cell array, (c) providing an expectation value data including second bit data of the N bits, (d) comparing the first bit data with the second bit data in units of bits to output a plurality of judgment signals indicative of the respective compared results, wherein a number of the plurality of judgment signals is the N, (e) providing a plurality of write circuits to write each of the second bit data of the N bits respectively in response to a control signal, wherein a number of the plurality of write circuits is the N, and (f) outputting the control signal to each of the N write circuits, in response to the plurality of judgment signals, wherein the (f) step includes determining a number of the plurality of write circuits to which the control signal is simultaneously outputted, based on the plurality of judgment signals, and outputting the control signal simultaneously to the plurality of write circuits corresponding to the determined number.

In this case, the (f) step includes detecting, as fail data, the first bit data which does not coincide with the second bit data based on the plurality of judgment signals, and detecting, as second detected result, a distribution of the fail data in the read out data to determine the number based on the second detected result.

BRIEF DESCRIPTION OF THE DRAWINGS

A more complete understanding of the teachings of the present invention may be acquired by referring to the accompanying figures, in which like reference numbers indicate like features and wherein:

FIG. 3 is an explanation view explaining a division write method using the conventional program verification method;

FIG. 4 is an explanation view showing a bit configuration of data having a length of 16 bits, to explain an embodiment of a nonvolatile semiconductor memory and a program verification method in the present invention;

FIG. 5 is an explanation view defining a flag used in the embodiment of the nonvolatile semiconductor memory and the program verification method in the present invention;

FIG. 8 is an explanation view to explain a relation between a state of a flag, a write procedure and a number of division write operations, in the embodiment of the nonvolatile semiconductor memory and the program verification method in the present invention;

DESCRIPTION OF THE PREFERRED EMBODIMENTS

Referring now to drawings, various preferred embodiments according to the present invention will be described in detail.

At first, a bit configuration having a data length of 16 bits used in a nonvolatile semiconductor memory of this embodiment is described with reference to FIG. 4.

As shown in FIG. 4, the bit configuration is provided with 16 bits from a least significant bit D0 to a most significant bit D15, and it is further divided into unit data (a) to (d) for each four bits. Moreover, all the 16 bits are divided into low order 8 bits from D0 to D7 and high order 8 bits from D8 to D15. Also in this embodiment, the number of bits that the write circuits can write at one time is assumed to be four bits, similarly to the conventional technique.

The data (read out signals) Dm0 to Dm15 corresponding to the respective bits D0 to D15 read out from a memory cell array 1 are compared with expectation value signals Dr0 to Dr15 corresponding to the respective bits in units of bits, as described later. The fact that they do not coincide with each other as the compared result is referred as "fail".

The implication of the respective flags detailed later will be described below with reference to FIG. 5. A flag F0 is a flag which becomes at a high level if 5 bits or more of all the 16 bits are in the fail. The flag F0 represents a ratio of the fails in the entire 16 bits. A flag F1 is a flag which becomes at the high level if 5 bits or more of the high order 8 bits are in the fail. A flag F2 is a flag which becomes at the high level if 5 bits or more of the low order 8 bits are in the fail. So, the respective flags F1, F2 represent ratios of the fails in the high order 8 bits and the low order 8 bits.

Moreover, a flag BFUB is a flag which becomes at the high level if the fail is not present in the high order 8 bits. A flag BFLB is a flag which becomes at the high level if the fail is not present in the low order 8 bits. Thus, it can be understood that the write operation need not to be performed on the high order 8 bits if the flag BFUB is at the high level, and similarly the write operation need not to be performed on the low order 8 bits if the flag BFLB is at the high level.

The situation of the values of the above-mentioned respective flags will be described below, for various cases shown in FIGS. 6A to 6E.

Figure 6:
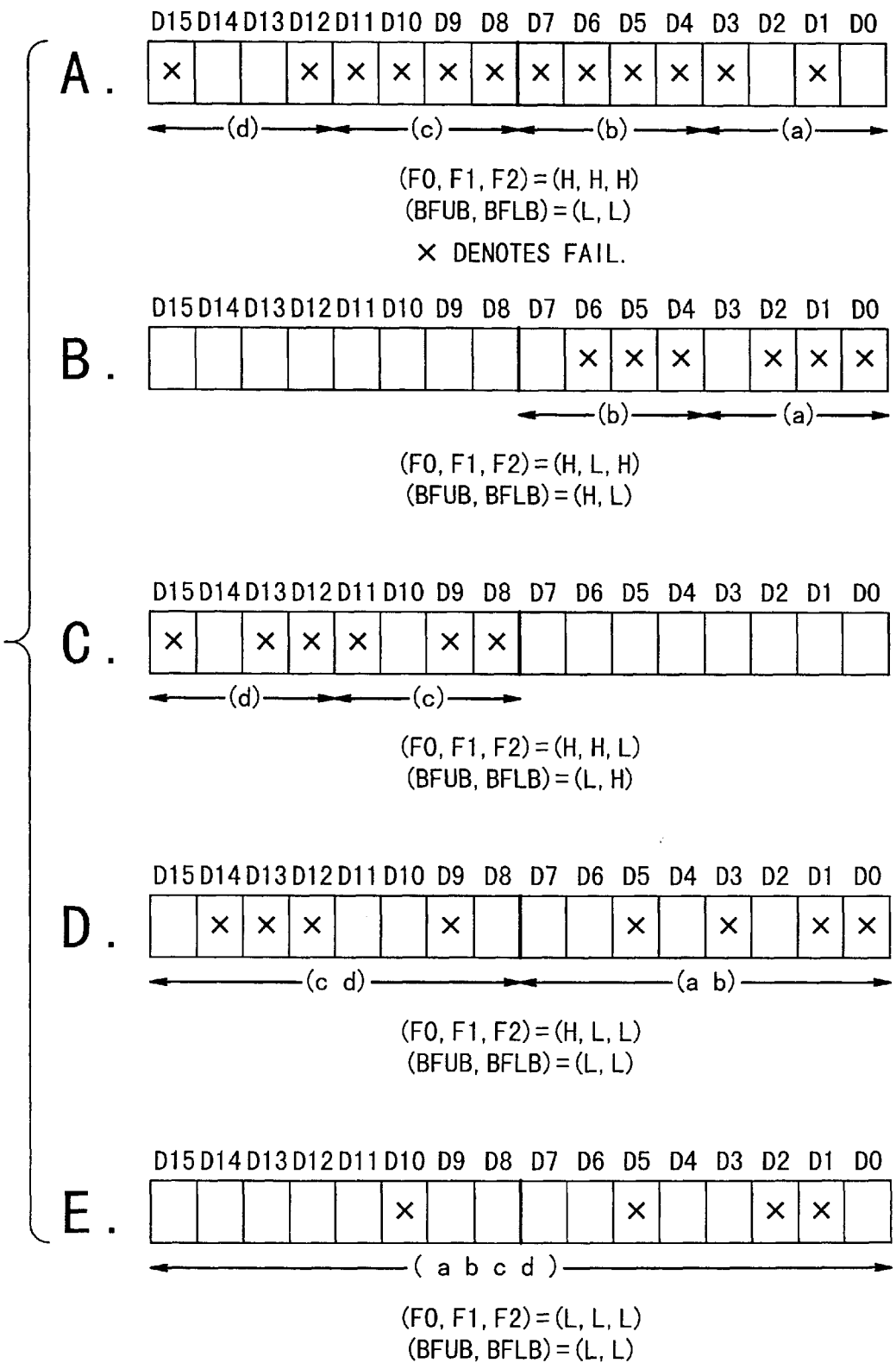
FIG. 6A is an explanation view to represent a distribution of a fail and a flag corresponding to it, in the embodiment of the nonvolatile semiconductor memory and the program verification method in the present invention.
FIG. 6B is an explanation view to represent another distribution of the fail and a flag corresponding to it, in the embodiment of the nonvolatile semiconductor memory and the program verification method in the present invention.
FIG. 6C is an explanation view to represent still another distribution of the fail and a flag corresponding to it, in the embodiment of the nonvolatile semiconductor memory and the program verification method in the present invention.
FIG. 6D is an explanation view to represent still another distribution of the fail and a flag corresponding to it, in the embodiment of the nonvolatile semiconductor memory and the program verification method in the present invention.
FIG. 6E is an explanation view to represent still another distribution of the fail and a flag corresponding to it, in the embodiment of the nonvolatile semiconductor memory and the program verification method in the present invention.

FIG. 6A represents a case in which the number of fails is very large. Then, the numbers of fails in the unit data (a) to (d) are 2, 4, 4 and 2, respectively. Thus, the number of fails in all the 16 bits is 12, the number of fails in the high order 8 bits is 6, and the number of fails in the low order 8 bits is 6. Accordingly, the flags F0, F1 and F2 are all at the high level, and the flags BFUB and BFLB are both at a low level.

In a case shown in FIG. 6B, the fail is not present in the high order 8 bits, and a flag BFUB is "H". Since the numbers of fails in the unit data (a) and (b) are respectively 3, the flag F0 is "H", the flag F1 is "L", the flag F2 is "H", and the flag BFUB is "L".

In a case shown in FIG. 6C, the fail is not present in the low order 8 bits, oppositely to the case of FIG. 6B. So, a flag BFLB is "H". Since the numbers of fails in the unit data (c) and (d) are respectively 3, the flag F0 is "H", the flag F1 is "H", the flag F2 is "L", and the flag BFUB is "L".

In a case shown in FIG. 6D, four fails are present in (ab) which jointly includes the unit data (a) and the unit data (b). Similarly, four fails are present in (cd) which jointly includes the unit data (c) and the unit data (d). Thus, the flag F0 is "H", the flag F1 is "L", the flag F2 is "L", the flag BFUB is "L", and the flag BFLB is "L". In this case, a single write operation an be performed in two write sessions (cycles).

FIG. 6E shows a case in which the number of ails of all the 16 bits (abcd) is 4. A single rite operation can be performed in a single write session (cycle).

The verification method in this embodiment will be described below with reference to the explanation views each representing the relation between a flag and a fail distribution shown in FIGS. 6A to 6E, a flowchart shown in FIG. 7, a table showing a state of a flag, a write procedure and a number of division write operations shown in FIG. 8, and write timing charts shown in FIGS. 9A to 9E.

Figure 2:
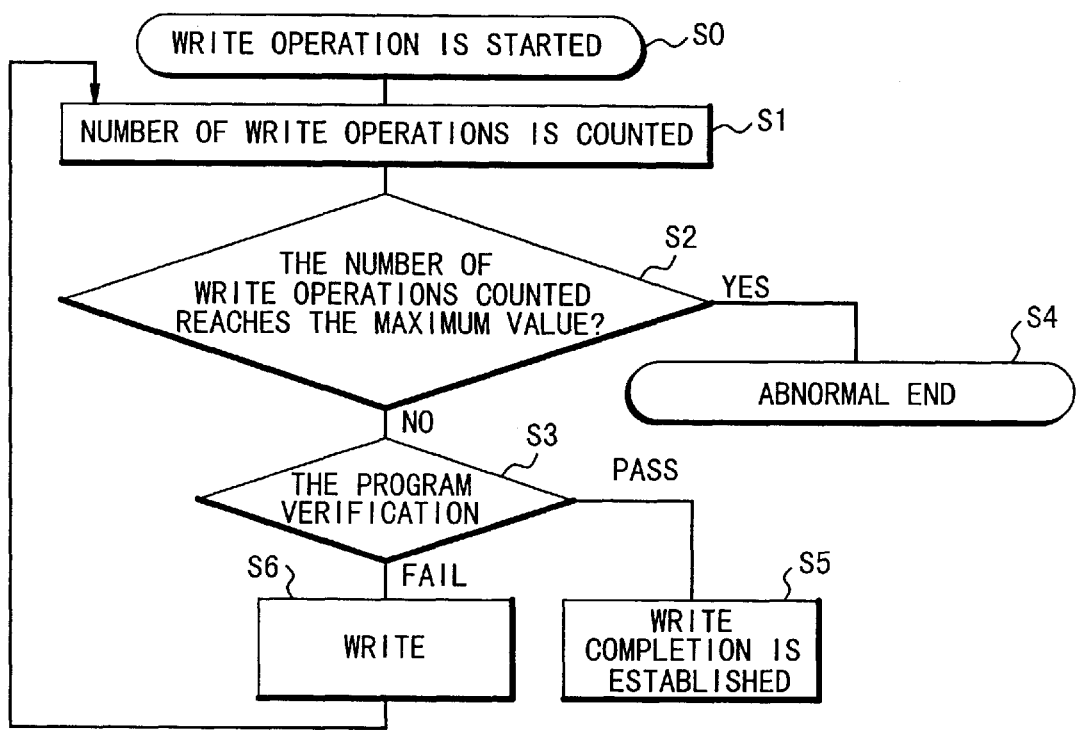
FIG. 2 is a flowchart representing a conventional program verification method.
Figure 7:
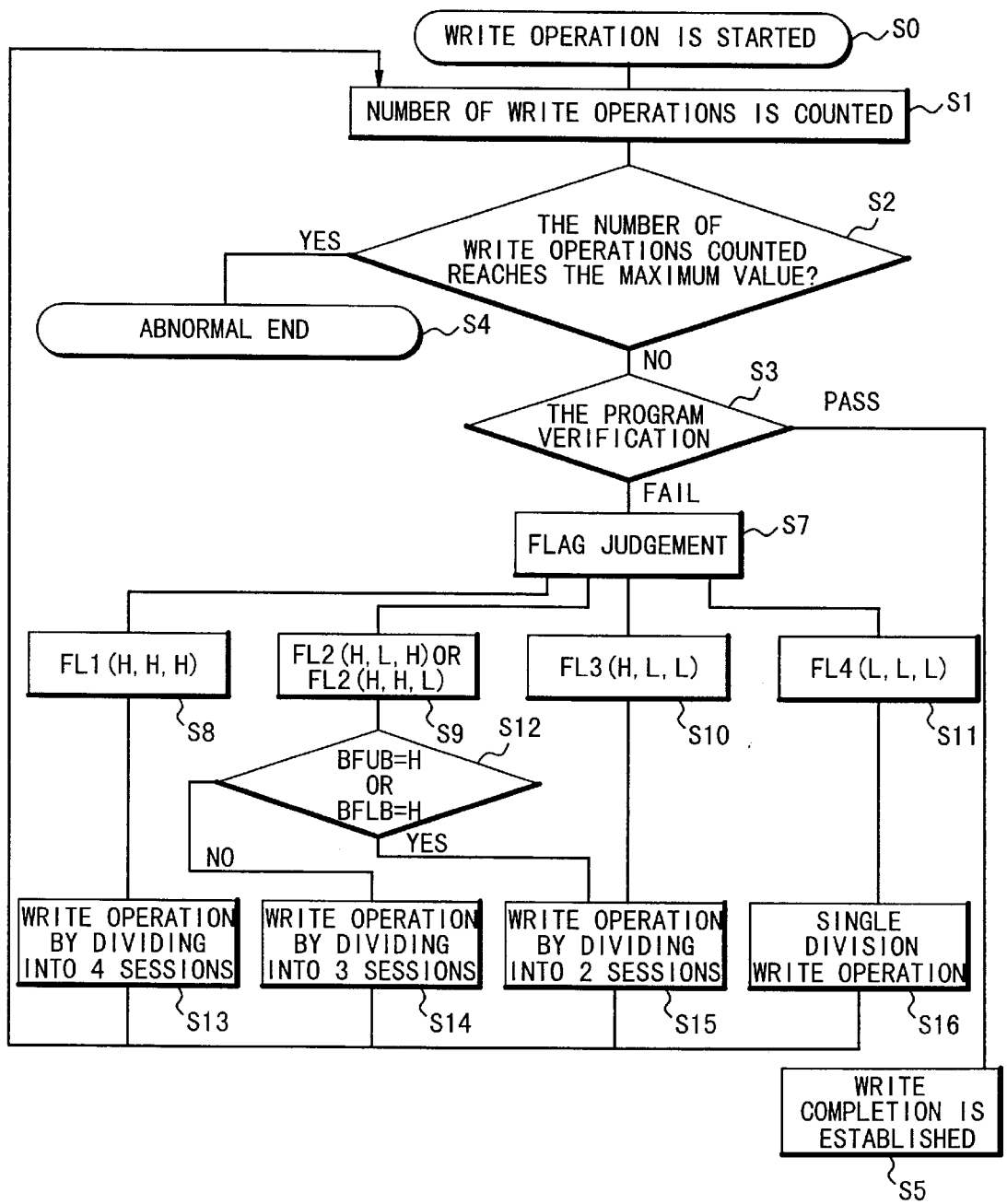
FIG. 7 is a flowchart representing the embodiment of the program verification method in the present invention.

Steps S0 to S5 in FIG. 7 are similar to the respective steps S0 to S5 shown in FIG. 2. Thus, the explanations thereof are omitted.

If it is judged as the fail in the program verification at the step S3, the respective flags explained with reference to FIG. 5 are judged at the step S7.

Figure 9A:
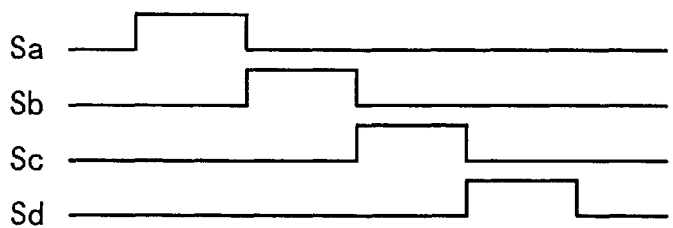
FIG. 9A is a timing chart representing a timing of a control signal according to the embodiment of the nonvolatile semiconductor memory and the program verification method in the present invention.

If the flags F0, F1 and F2 are all at "H" as shown in FIG. 6A, the flag is at FL1 (H,H,H) at the step S8, and the write procedure is performed by dividing into four write sessions of (a)→(b)→(c)→(d) in the order of the unit data as shown in FIG. 8A. That is, control signals Sa to Sd serving as a positive pulse signal are generated in the order of Sa, Sb, Sc and Sd as shown in FIG. 9A. Then, the write operation is performed by dividing-into the four sessions. That is, a single write operation is performed in four write sessions (cycles).

Next, if the flags F0, F1 and F2 are at "H", "L" and "H" as shown in FIG. 6B, or if the flags F0, F1 and F2 are at "H", "H" and "L" as shown in FIG. 6C (Step S9), it is judged at a step S12 whether or not the flag BFUB or BFLB is at "H". If at least one flag of the flags BFUB and BFLB is at "H", a write operation is performed by dividing into two sessions at a step S15. That is, a single write operation is performed in two write sessions (cycles). If both the flags BFUB and BFLB are at "L", a write operation is performed by dividing into three sessions at a step S14. That is, a single write operation is performed in three write sessions (cycles).

The above-mentioned procedure is actually described.

Figure 9B:
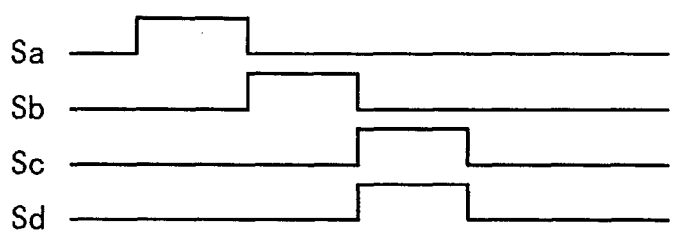
FIG. 9B is a timing chart representing a timing of another control signal according to the embodiment of the nonvolatile semiconductor memory and the program verification method in the present invention.
Figure 9C:
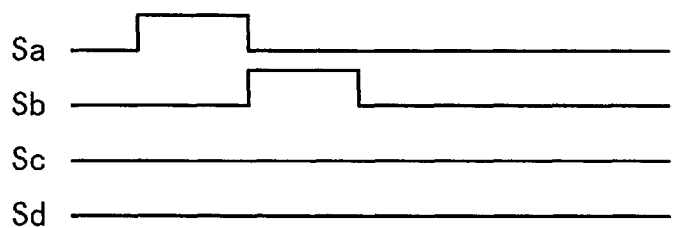
FIG. 9C is a timing chart representing a timing of still another control signal according to the embodiment of the nonvolatile semiconductor memory and the program verification method in the present invention.

In a case of (B1) of FIG. 8, both the flags BFUB and BFLB are at "L". Thus, the write procedure is (a)→(b)→(cd), and is performed by dividing into the three write sessions (Step S14). Then, the single write operation is performed in the three write sessions (cycles). That is, since the flag F1 is at "L", the number of fails in the high order 8 bits is four bits or less. Hence, the unit data (c) and (d) are collected into (cd) to complete at the single write session (cycle). FIG. 9B shows the control signals Sa to Sd at this time. Positive pulse signals are generated in the order of Sa and Sb. Next, the positive pulse signals Sc, Sd are simultaneously generated for the unit data (c) and the unit data (d).

Next, in a case of (B2) of FIG. 8, the flag BFUB is at "H" as shown in FIG. 6C. Thus, the fail is not present in the high order 8 bits. Hence, the write procedure is targeted for the low order 8 bits. Then, the write procedure is performed by dividing into the two write sessions of (a)→(b) at a step S15 (refer to FIG. 9C). A single write operation is performed in two write sessions (cycles).

Similarly, in a case of (C2) of FIG. 8, the flag BFLB is at "H" as shown in FIG. 6C. Thus, the fail is not present in the low order 8 bits. Hence, the write procedure is targeted for the high order 8 bits. Then, the write procedure is performed by dividing into the two write sessions of (c)→(d) at the step S15. A single write operation is performed in two write sessions (cycles).

Figure 9D:
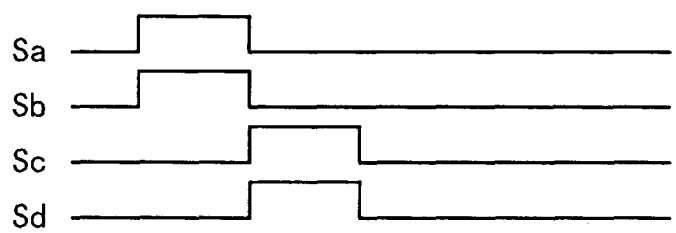
FIG. 9D is a timing chart representing a timing of still another control signal according to the embodiment of the nonvolatile semiconductor memory and the program verification method in the present invention.

Next, if the flags F0, F1 and F2 are respectively at "H", "L" and "L" as shown in FIG. 6D, the flag is at FL3 (H,L,L) at the step S10, and the respective number of fails in both the high order 8 bits and the low order 8 bits is four or less. Thus, the write procedure is performed by dividing into the two write sessions of (ab)→(cd) as shown in (D) of FIG. 8. A single write operation is performed in two write sessions (cycles). That is, as shown in FIG. 9D, the positive pulse signals Sa, Sb are simultaneously generated for the unit data (a) and (b). Next, the positive pulse signals Sc, Sd are simultaneously generated for the unit data (c) and (d). So, the write operation is performed by dividing into the two write sessions.

Figure 9E:
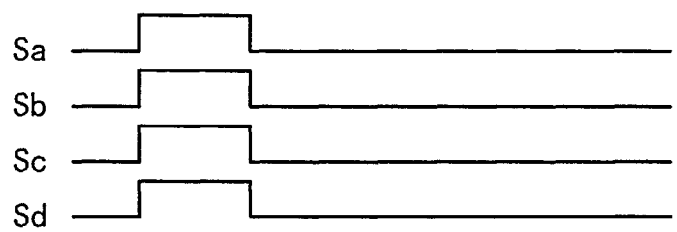
FIG. 9E is a timing chart representing a timing of still another control signal according to the embodiment of the nonvolatile semiconductor memory and the program verification method in the present invention.

Next, if all the flags F0, F1 and F2 are at "L" as shown in FIG. 6E, the flag is at FL4 (L,L,L) at the step S11. The write procedure is performed in a single division write operation of (abcd) as shown in FIG. 8E. A single write operation is performed in a single write session (cycle). That is, as shown in FIG. 9E, the positive pulse signals are simultaneously generated for the control signals Sa to Sd, and a single division write operation is performed.

After the execution of steps S13 to S16, the number of write operations is counted at the step S1. Then, the processes on and after the step S2 are similarly repeated.

As mentioned above, there is the limitation of the four circuits, with regard to the number of write circuits which can be driven simultaneously at the single write session (cycle) of the single write operation. Then, each flag is used to judge the distribution of the fails in all the bits. In accordance with the judged result, the write range written in the single write session (cycle) is not always limited to one of the unit data (a), (b), (c) and (d), and it is changed into (ab) or (abcd) into which those unit data (a), (b), (c) and (d) are collected or the like. Moreover, the program verification is performed with a smaller number of write sessions by deleting the write cycle to the unit data in which the fail is not present.

That is, in the nonvolatile semiconductor memory and the program verification method according to the present invention, the useless write cycle can be removed to thereby make the write time shorter.

The nonvolatile semiconductor memory in this embodiment will be described below with reference to FIGS. 10 and 11.

Figure 10:
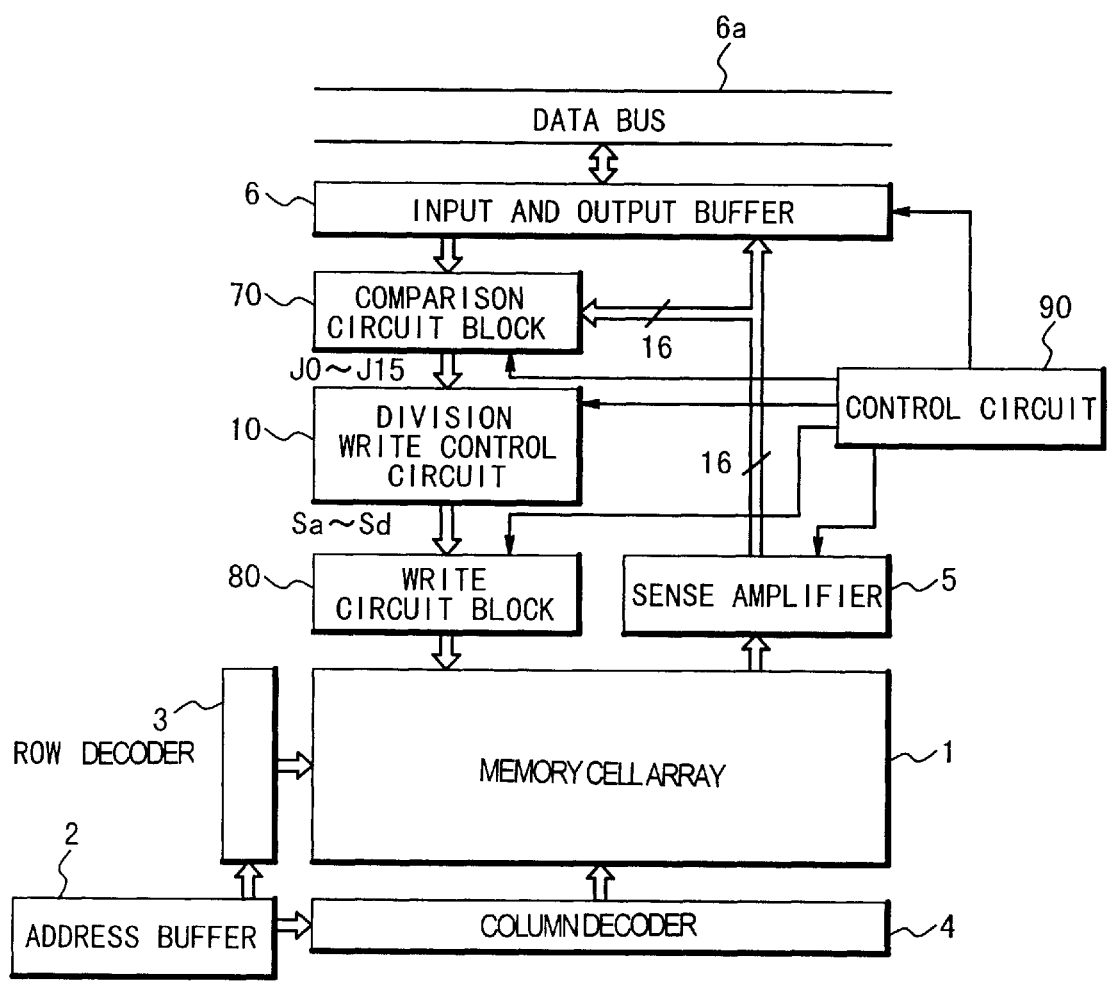
FIG. 10 is a block diagram showing the embodiment of the nonvolatile semiconductor memory in the present invention.

As shown in FIG. 10, the nonvolatile semiconductor memory in this embodiment is provided with the memory cell array 1, an address buffer 2, a row decoder 3, a column decoder 4, a sense amplifier 5, an input and output buffer 6, a comparison circuit block 70, a write circuit block 80, a control circuit 90 and a division write control circuit 10.

Figure 1:
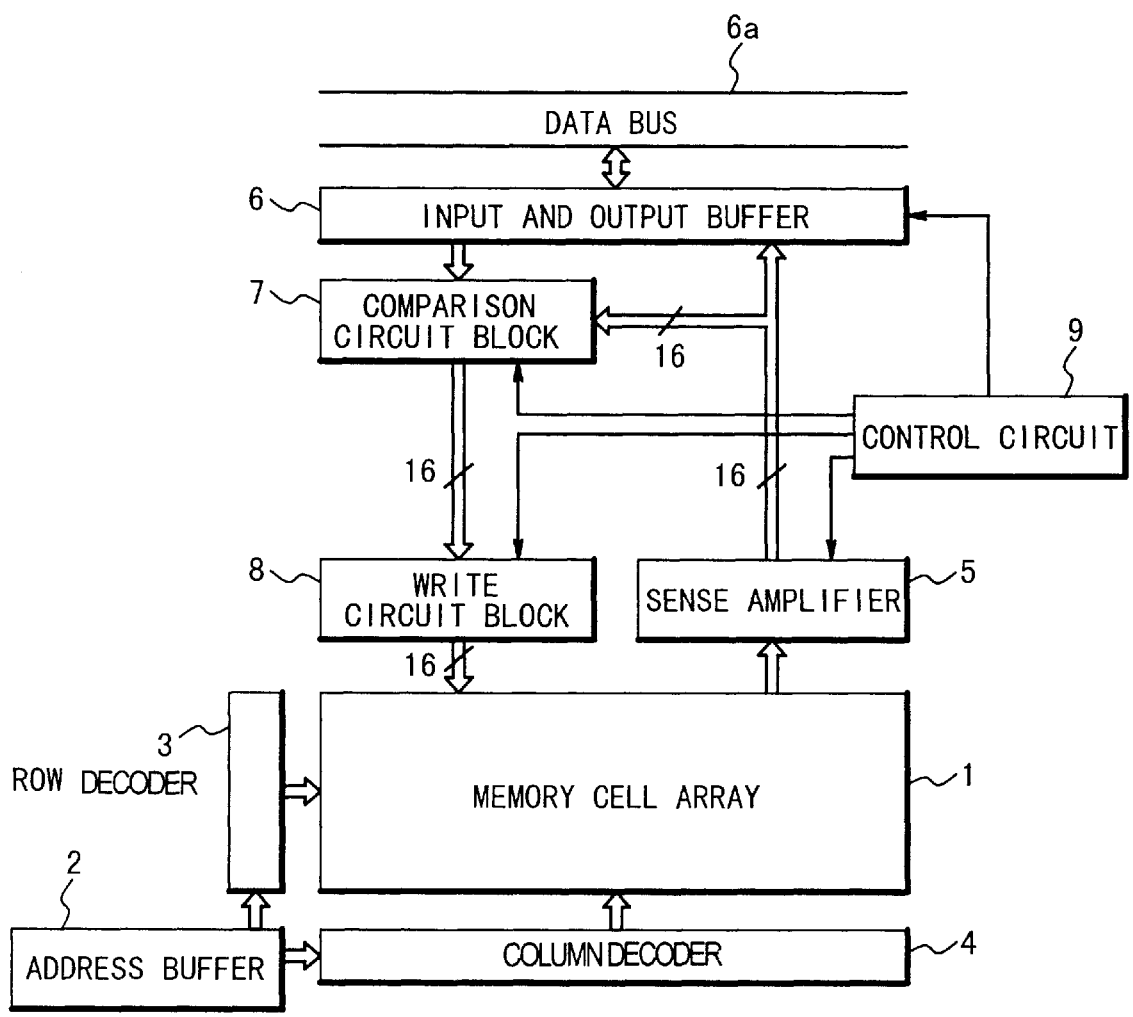
FIG. 1 is a block diagram showing a conventional nonvolatile semiconductor memory.

In FIG. 10, the elements from the memory cell array 1 to the input and output buffer 6 perform the circuit operations similar to those of the conventional nonvolatile semiconductor memory shown in FIG. 1.

The comparison circuit block 70 compares signals Dm0 to Dm15 (read out signals, read out data), in which the data stored in the memory cell array 1 is amplified by the sense amplifier 5, with signals (expectation value signals, expectation value data) Dr0 to Dr15 in which the data sent from a data bus 6a is amplified by the input and output buffer 6. The comparison circuit block 70 outputs comparison data J0 to J15 indicative of the compared result for each bit, to the division write control circuit 10, as the compared result. The read out data Dm0 corresponds to the least significant bit D0, and the read out data Dm15 corresponds to the most significant bit D15. The expectation value data Dr0 corresponds to the least significant bit D0, and the expectation value data Dr15 corresponds to the most significant bit D15. The comparison data J0 shows the compared result between the expectation value data Dr0 and the read out data Dm0 corresponding to the least significant bit D0. The comparison data J15 shows the compared result between the expectation value data Dr15 and the read out data Dm15 corresponding to the most significant bit D15.

The write circuit block 80 outputs write signals WR0 to WR15 to the memory cell array 1 to write the data thereto, if the signals (read out signals) Dm0 to Dm15 outputted by the sense amplifier 5 do not coincide with the output signals (expectation value signals) Dr0 to Dr15 from the input and output buffer 6, as the compared result by the comparison circuit block 70. The write signal WR0 is intended to write the expectation value data Dr0, and the write signal WR15 is intended to write the expectation value data Dr15.

The control circuit 90 controls the sense amplifier 5, the input and output buffer 6, the comparison circuit block 70, the write circuit block 80 and the like.

The division write control circuit 10, based on the comparison data J0 to J15 inputted from the comparison circuit block 70, generates the flags F0 to F2, BFUB and BFLB to output the control signals Sa to Sd as shown in FIGS. 9A to 9E to the write circuit block 80.

Figure 11:
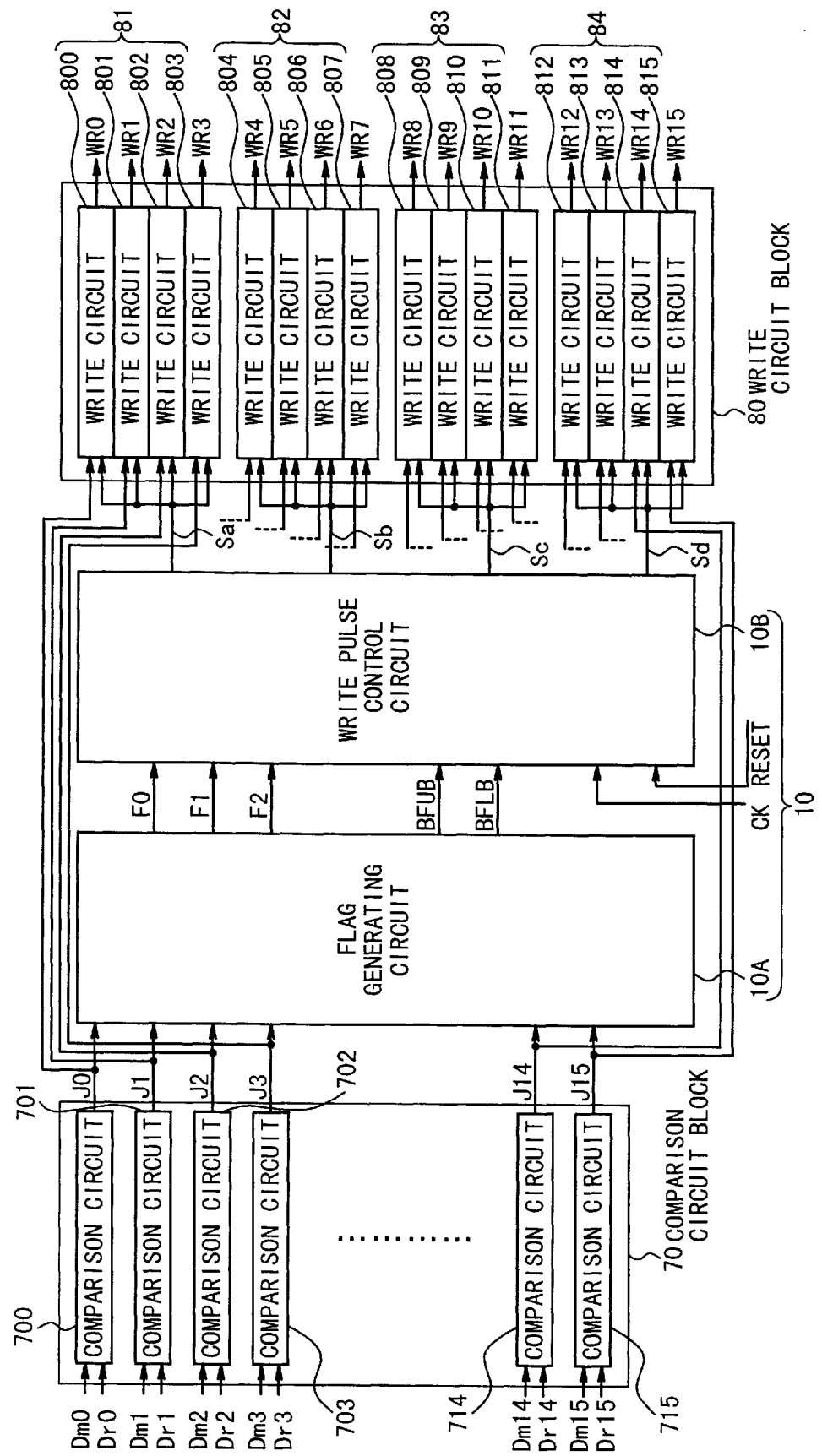
FIG. 11 is a block diagram to explain in further detail a comparison circuit block, a division write control circuit and a write circuit block of the embodiment of the nonvolatile semiconductor memory in the present invention.

FIG. 11 is a further detailed circuit block diagram of the comparison circuit block 70, the write circuit block 80 and the division write control circuit 10. As shown in FIG. 11, the division write control circuit 10 includes a flag generating circuit 10A and a write pulse control circuit 10B.

The comparison circuit block 70, the flag generating circuit 10A, the write pulse control circuit 10B and the write circuit block 80 will be described below with reference to FIG. 11.

The comparison circuit block 70 includes 16 comparison circuits 700 to 715. The comparison circuits 700 to 715 respectively compare the expectation value signals Dr0 to Dr15 inputted through the input and output buffer 6 with the read out signals Dm0 to Dm15 from the memory cell array 1 through the sense amplifier 5 to output the comparison data J0 to J15 indicative of the comparison results.

Figure 12:
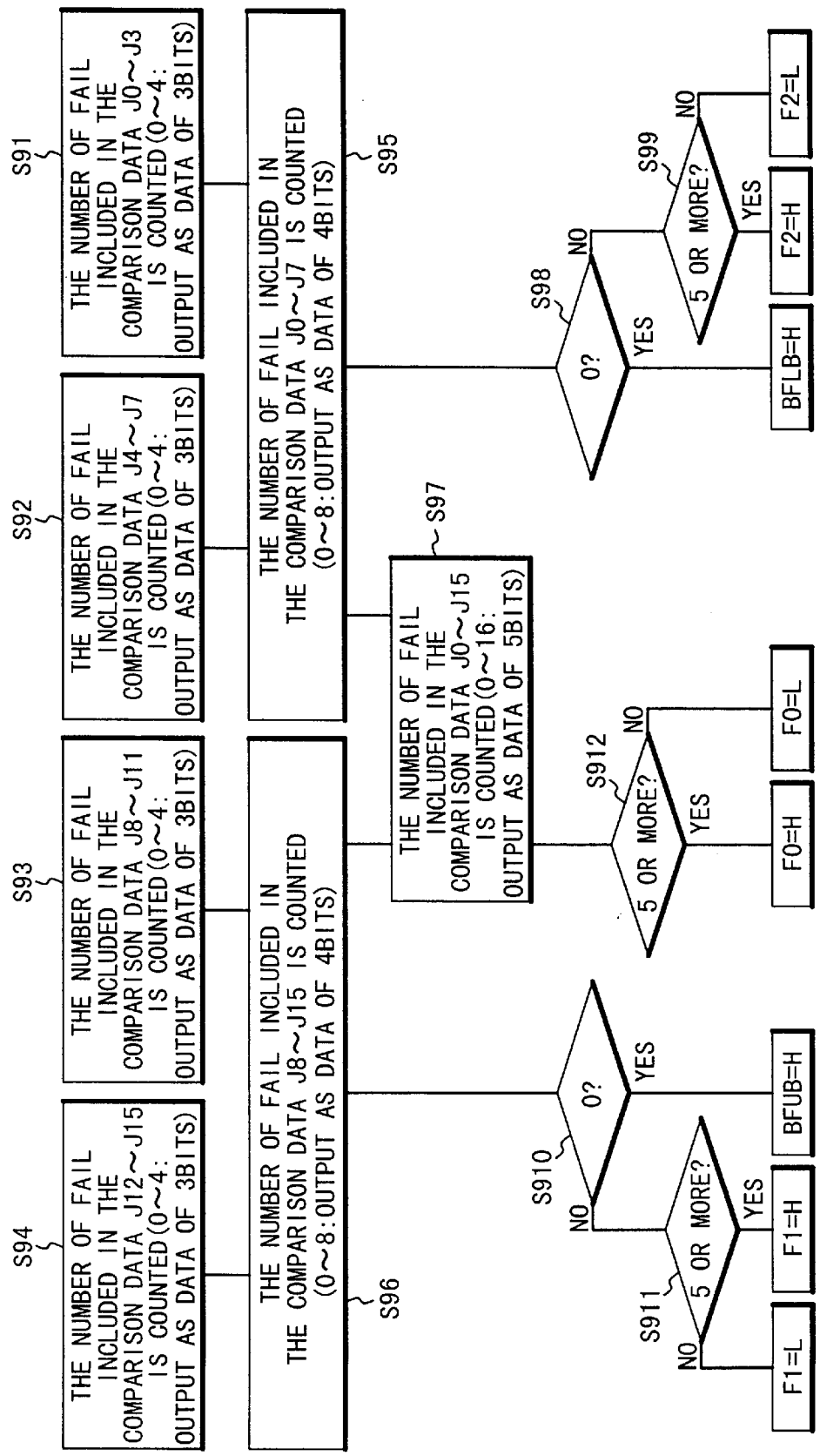
FIG. 12 is a flowchart to explain an operation of a flag generating circuit of the embodiment of the nonvolatile semiconductor memory in the present invention.

The flag generating circuit 10A is a circuit for generating the flags F0, F1, F2, BFUB and BFLB shown in FIG. 5. FIG. 12 shows the processing procedure of the flag generating circuit 10A.

In FIG. 12, the numbers of fails included in the comparison data J0 to J3, J4 to J7, J8 to J11 and J12 to J15 for each four bits are counted at steps S91 to S94. This number of fails corresponds to any numeral between 0 and 4 to be represented as data of 3 bits.

Next, the numbers of fails of the comparison data J0 to J7 and J8 to J15 are counted at a step S95 and a step S96, respectively. This number of fails corresponds to any numeral between 0 and 8 to be represented as data of 4 bits.

Next, at a step S97, the count values respectively obtained at the steps S95, S96 are added to thereby calculate the number of fails. This number of fails correspond to any numeral between 0 and 15 to be represented as a count value of 5 bits. In succession, it is judged at a step S912 whether or not this count value is 5 or more. If the count value is 5 or more, the flag F0 is set to "H". If it is 4 or less, the flag F0 is set to "L".

Next, it is judged at a step S98 whether or not the count value obtained at the step S95 is 0. If the count value is 0, the flag BFLB is set to "H". If the count value is not 0, it is judged at a step S99 whether or not the count value is 5 or more. If the count value is 5 or more, the flag F2 is set to "H". If it is 4 or less, the flag F2 is set to "L".

Next, it is judged at a step S910 whether or not the count value obtained at the step S96 is 0. If the count value is 0, the flag BFUB is set to "H". If the count value is not 0, it is judged at a step S911 whether or not the count value is 5 or more. If the count value is 5 or more, the flag F1 is set to "H". If it is 4 or less, the flag F1 is set to "L".

Figure 13:
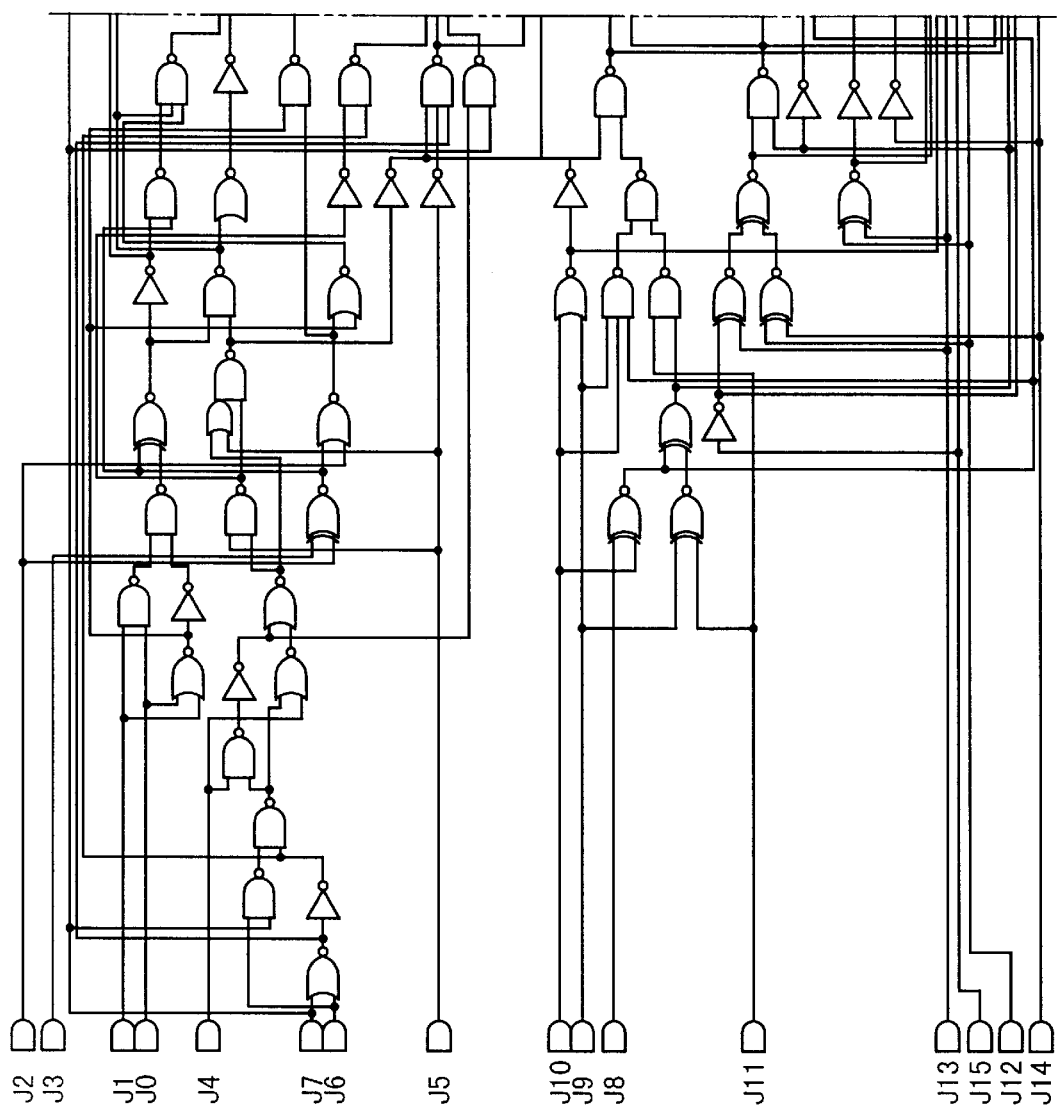
FIG. 13(A) is a part of a circuit diagram showing an embodiment of the flag generating circuit of the nonvolatile semiconductor memory in the present invention.
FIG. 13(B) is the other part of the circuit diagram showing an embodiment of the flag generating circuit of the nonvolatile semiconductor memory in the present invention.
Figure 13:
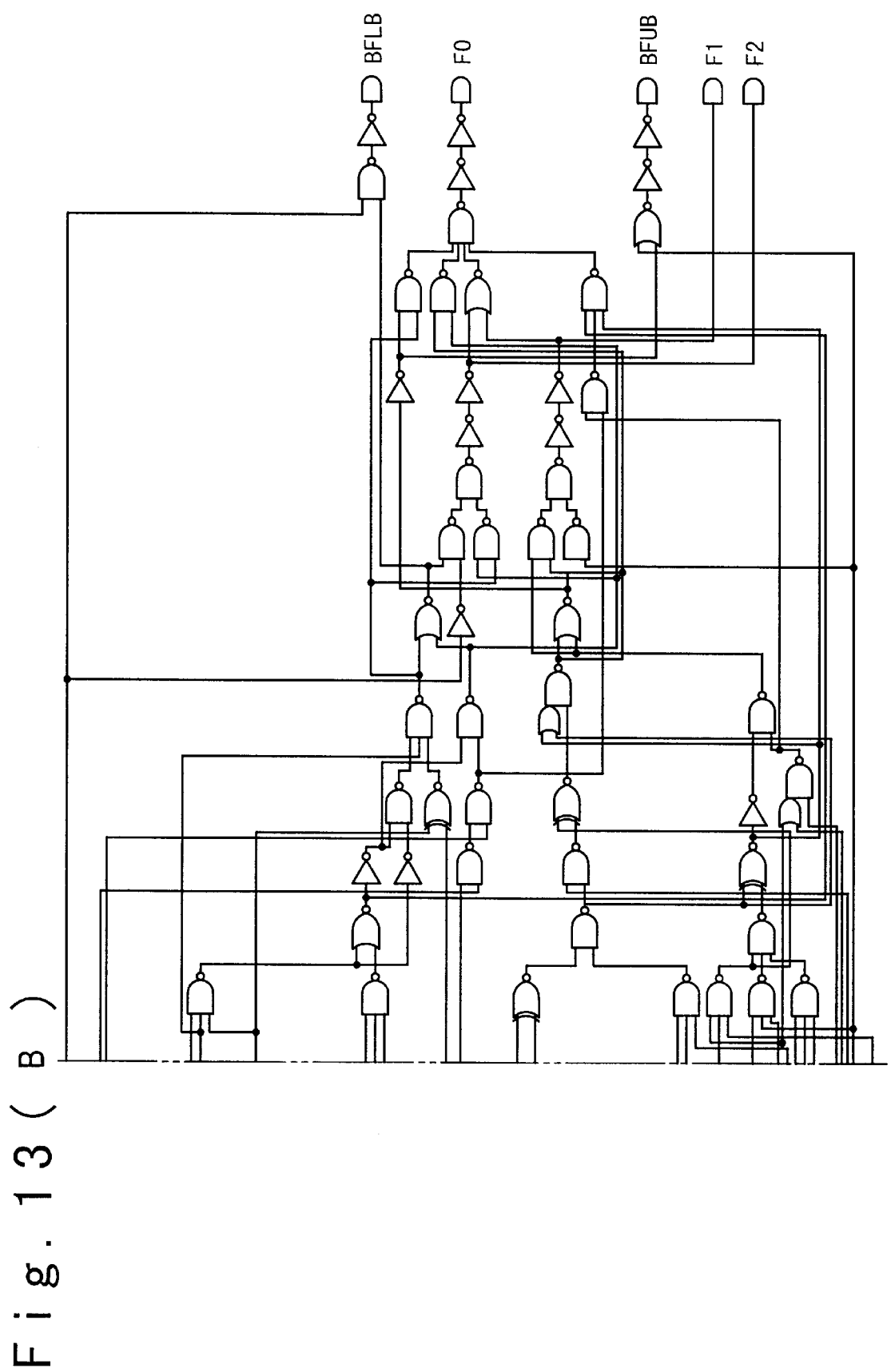

The flags shown in FIG. 5 are generated by the above-mentioned procedure. FIG. 13(A) and (B) show an embodiment of the flag generating circuit 10A to embody the flowchart in FIG. 12. In this circuit, judgment signals (comparison data) J0 to J15 are inputted to left ends. The signals are transmitted through a combination circuit provided with an inverter, a NAND gate, a NOR gate, an EXOR gate and an EXNOR gate to a right side. Then, the flags F0, F1, F2, BFUB and BFLB are outputted.

Returning back to FIG. 11, the write pulse control circuit 10B will be described below.

Figure 14A:
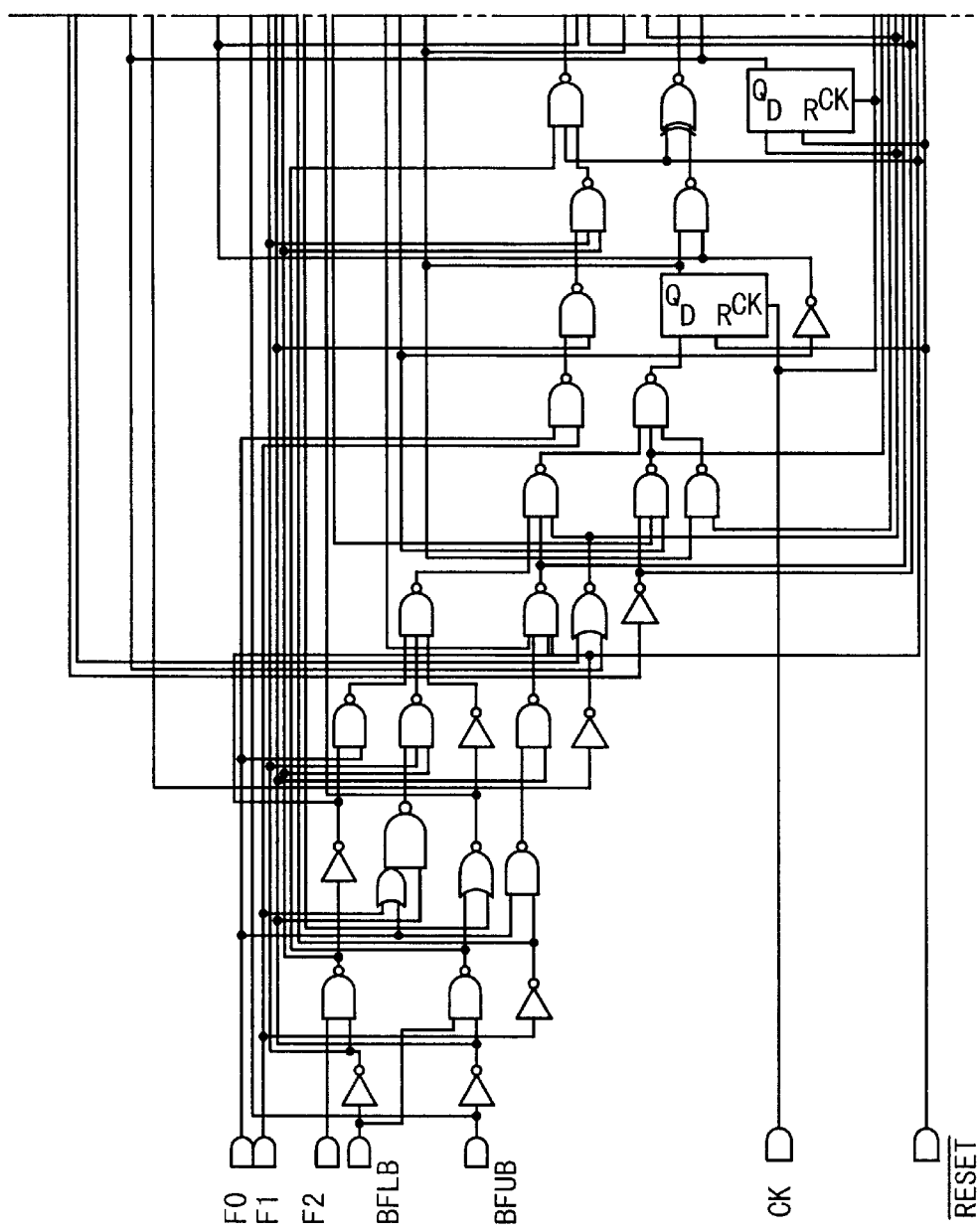
FIG. 14(A) is a part of a circuit diagram showing an embodiment of a write pulse control circuit of the nonvolatile semiconductor memory in the present invention.
Figure 14B:
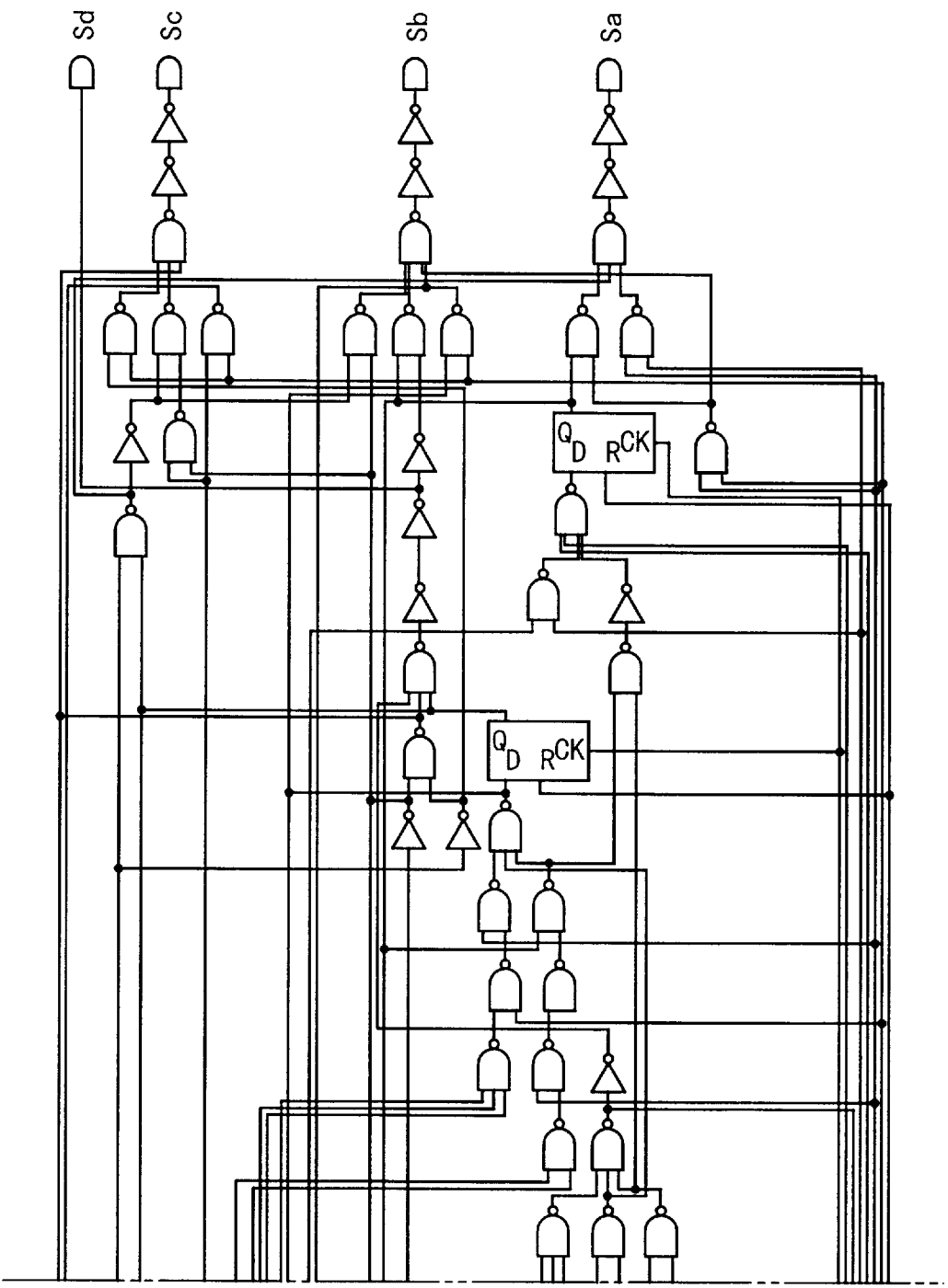
FIG. 14(B) is the other part of the circuit diagram showing an embodiment of a write pulse control circuit of the nonvolatile semiconductor memory in the present invention.

The write pulse control circuit 10B receives the flags F0, F1, F2, BFUB and BFLB from the flag generating circuit 10A to output the pulse signals (control signals) Sa to Sd shown in FIGS. 9A to 9E, to the write circuit block 80. FIGS. 14(A) and (B) show an embodiment of the write pulse control circuit 10B. In this circuit, the flags F0, F1, F2, BFUB and BFLB, and a clock signal CK and an inversion reset signal /Reset are inputted to left ends. The signals are transmitted through an order circuit provided with an inverter, a NAND gate, an OR gate, a NOR gate, an EXNOR gate and a flip-flop to a right side. Then, the control signals Sa, Sb, Sc and Sd are outputted.

As shown in FIG. 11, the write circuit block 80 has 16 write circuits 800 to 815, each corresponding to each of the 16 bits. The 16 write circuits 800 to 815 are grouped into each four circuits in accordance with the arrayed order of the 16 bits to be allocated to four groups 81 to 84. A first group 81 has the write circuits 800 to 803, a second group 82 has the write circuits 804 to 807, a third group 83 has the write circuits 808 to 811, and a fourth group 84 has the write circuits 812 to 815.

The control signal Sa outputted by the write pulse control circuit 10B is simultaneously inputted to the respective write circuits 800 to 813 of the first group 81. The respective write circuits 800 to 803 are made active when receiving the control signal Sa.

If the comparison data J0 indicates that the bit data Dm0 corresponding to the least significant bit D0 of the read out data does not coincide with the bit data Dr0 corresponding to the least significant bit D0 included in the expectation value signal, the write circuit 800 receiving the comparison data J0 outputs the write signal WR0 to the memory cell, at a timing when the write circuit 800 is made active by receiving the control signal Sa. The write signal WR0 is a signal to write the bit data Dr0 to the memory cell.

Similarly, the control signal Sb is simultaneously inputted to the respective write circuits 804 to 807 of the second group 82. The control signal Sc is simultaneously inputted to the respective write circuits 808 to 811 of the third group 83. And, the control signal Sd is simultaneously inputted to the respective write circuits 812 to 815 of the fourth group 84.

Also, the write circuit 800 receives the comparison data J0 from a comparison circuit 700. The write circuit 801 receives the comparison data J1 from a comparison circuit 701 And, the write circuit 802 receives the comparison data J2 from a comparison circuit 702.

If the received comparison data J0 indicates that the expectation value signal Dr0 and the read out signal Dm0 coincide with each other, the write circuit 800, since an output section thereof has a high impedance, does not output the write signal WR0. Thus, the expectation value signal Dr0 is never newly written to a memory cell corresponding to the least significant bit D0, in this time.

If the received comparison data J1 indicates that the expectation value signal Dr1 and the read out signal Dm1 coincide with each other, the write circuit 801, since an output section thereof has a high impedance, does not output the write signal WR1. Thus, the expectation value signal Dr1 is never newly written to a memory cell corresponding to the bit D1 adjacent to the least significant bit D0, in this time.

The similar operation is performed in the write circuits 802, 803.

On the other hand, if the received comparison data J0 indicates that the expectation value signal Dr0 and the read out signal Dm0 do not coincide with each other, the write circuit 800 again amplifies the expectation value signal Dr0 to output the write signal WR0 to a memory cell array 1 corresponding to the least significant bit D0, in accordance with a timing shown by a symbol Sa of FIGS. 9A to 9E. Accordingly, the expectation value signal Dr0 is written to the memory cell array 1.

If the received comparison data J1 indicates that the expectation value signal Dr1 and the read out signal Dm1 do not coincide with each other, the write circuit 801 again amplifies the expectation value signal Dr1 to output the write signal WR1 to a memory cell array 1 corresponding to the bit D1 adjacent to the least significant bit D0, in accordance with a timing shown by a symbol Sa of FIGS. 9A to 9E. Accordingly, the expectation value signal Dr1 is written to the memory cell array 1.

The similar operation is performed in the write circuits 802, 803.

Similarly, the comparison data J4 to J7, J8 to J11 and J12 to J15 from the respective comparison circuits 704 to 707, 708 to 711 and 712 to 715 are inputted to the write circuits 804 to 807, 808 to 811 and 812 to 815, respectively. If the inputted comparison data J4 to J7, J8 to J11 and J12 to J15 indicate that the expectation value signals Dr4 to Dr7, Dr8 to Dr 11 and Dr12 to Dr15 coincide with the read out signals Dm4 to Dm7, Dm8 to Dm11 and Dm12 to Dm15, respectively, the write circuits 804 to 807, 808 to 811 and 812 to 815, since output sections thereof have high impedances, do not output the write signals WR4 to WR7, WR8 to WR11 and WR12 to WR15, respectively.

On the other hand, if the inputted comparison data J4 to J7, J8 to J11 and J12 to J15 indicate that the expectation value signals Dr4 to Dr7, Dr8 to Dr 11 and Dr12 to Dr15 do not coincide with the read out signals Dm4 to Dm7, Dm8 to Dm11 and Dm12 to Dm15, respectively, the write circuits 804 to 807, 808 to 811 and 812 to 815 again amplify the expectation value signals Dr4 to Dr7, Dr8 to Dr11 and Dr12 to Dr15 to output the write signals WR4 to WR7, WR8 to WR11 and WR12 to WR15, in accordance with timings shown by symbols Sb to Sd of FIGS. 9A to 9E. Accordingly, the expectation value signals Dr4 to Dr7, Dr8 to Dr11 and Dr12 to Dr15 are written to the memory cell array 1.

As mentioned above, the nonvolatile semiconductor memory according to this embodiment has the division write control circuit 10 provided with the flag generating circuit 10A and the write pulse control circuit 10B. Accordingly, the nonvolatile semiconductor memory generates the flags F0, F1, F2, BFUB and BFLB in accordance with the distribution of the fails included in all the bits to generate the control signals Sa to Sd based on those flags F0, F1, F2, BFUB and BFLB. The nonvolatile semiconductor memory controls the write circuits 800 to 815 based on the comparison signals (data) J0 to J15 and the control signals Sa to Sd. In the nonvolatile semiconductor memory, the write unit (write range) is changed into the unit such as (a), (b), (abcd) and the like, in accordance with the distribution of the fails. Then, it is possible to reduce the number of division write sessions and thereby remove the useless write cycle. Accordingly, the program verification can be performed with the smaller number of write sessions.

For example, in the case of FIG. 3, the conventional example of FIGS. 1 and 2 needs the four write sessions. However, this embodiment can complete the write operation in the single write session, in the case of FIG. 3.

The case of the data having the length of the 16 bits has been described in the above-mentioned embodiment. However, it is not limited to the length of the 16 bits, and it can be similarly applied to data having a length of other bits. For example, if a four-bit is defined as unit data (the number of bits which can be written one time) and a data length is 24 bits, a flag is generated in which the 24 bits are classified into a high order bit (judgment portion), a middle order bit (judgment portion) and a low order bit (judgment portion) with 8 bits as a unit.

As mentioned above, according to the nonvolatile semiconductor memory and the program verification method in the present invention, it is possible to generate the flags and the control signals in accordance with the distribution of the fails included in all the bits and then change the bit configuration of the write unit to thereby remove the useless write cycle and accordingly make the time of the write operation shorter.

The nonvolatile semiconductor memory and the program verification method according to the present invention provides the larger effect as the number of fails is smaller and the distribution of the fails is largely biased (unbalanced).

What is claimed is:

1. A nonvolatile semiconductor memory comprising:
   a memory cell array including a plurality of nonvolatile memory cells;
   a comparing section comparing a read out data including a plurality of first bit data read out from said memory cell array with an expectation value data including a plurality of second bit data in units of bits, to output a judgment signal indicative of the comparison results;
   a plurality of write circuits respectively provided for said plurality of first bit data and writing each of said plurality of second bit data to a part of said memory cell array, in response to a control signal and said judgment signal; and a control section selectively making active said plurality of write circuits by outputting said control signal to each of said plurality of write circuits, in response to said judgment signal, the number of said write circuits to be selectively made active by said control section being variable based on said judgment signal.

2. A nonvolatile semiconductor memory according to claim 1, wherein said control section outputs said control signal to ones selected from said plurality of write circuits at timings identical to each other, as selected circuits, and determines a number of said selected circuits based on said judgment signal.

3. A nonvolatile semiconductor memory according to claim 2, wherein said control section determines said number of said selected circuits such that said number is equal to or less than a predetermined value.

4. A nonvolatile semiconductor memory according to claim 3, wherein said plurality of write circuits are classified into a plurality of groups, and said control section outputs said control signal to said write circuits belonging to each of said plurality of groups at timings identical to each other, and determines said number of selected circuits with each of said plurality of groups as a unit.

5. A nonvolatile semiconductor memory according to claim 4, wherein said plurality of write circuits are classified into said plurality of groups, based on an array order of said plurality of first bit data in said read out data, and said control section detects, as fail data, said first bit data which do not coincide with said second bit data based on said judgment signal, and detects, as a second detection result, a distribution of said fail data in said read out data, to determine said number of selected circuits based on said second detection result.

6. A nonvolatile semiconductor memory according to claim 5, wherein said control section generates a plurality of flag signals to indicate said second detection result, and determines said number of selected circuits based on said plurality of generated flag signals.

7. A nonvolatile semiconductor memory according to claim 5, wherein said control section generates a plurality of flag signals to indicate said second detection result, and said plurality of flag signals includes:

a first flag signal whose signal level changes from a first level to a second level, when a number of said fail data exceeds a predetermined value, said fail data being included in all of said first bit data in said read out data;

a second flag signal whose signal level changes from a first level to a second level, when said number of fail data exceeds said predetermined value, said fail data being included in a first portion of all of said first bit data in said read out data;

a third flag signal whose signal level changes from a first level to a second level, when said number of fail data exceeds said predetermined value, said fail data being included in a second portion other than said first portion of all of said first bit data in said read out data;

a fourth flag signal whose signal level changes from a first level to a second level, when said number of fail data is zero, said fail data being included in said first portion of all of said first bit data in said read out data; and a fifth flag signal whose signal level changes from a first level to a second level, when said number of fail data is zero, said fail data being included in said second portion of all of said first bit data in said read out data.

8. A nonvolatile semiconductor memory according to claim 7, wherein said control section:

outputs said control signal to each of said plurality of groups at timings different from each other, when all of said first to third flag signals are in said second level;

outputs said control signal to each of said plurality of groups at timings identical to each other, when all of said first to third flag signals are in said first level;

does not output said control signal to each of ones of said plurality of groups corresponding to said first portion, when said fourth flag signal is in said second level; and does not output said control signal to each of ones of said plurality of groups corresponding to said second portion, when said fifth flag signal is in said second level.

9. A nonvolatile semiconductor memory according to claim 4, wherein said control section determines a timing when outputting said control signal to each of said plurality of groups, based on said determined number of selected circuits.

10. A nonvolatile semiconductor memory according to claim 2, wherein a single write operation when said plurality of second bit data are written to said part of said memory cell array includes one cycle or a plurality of cycles, and said control section determines a number of said cycles in said single write operation, based on said determined number of selected circuits.

11. A program verification method of a nonvolatile semiconductor memory comprising:

(a) reading out first bit data from each of a plurality of nonvolatile memory cells;

(b) providing second bit data to be written to each of said plurality of memory cells;

(c) judging whether or not each of a plurality of said first bit data coincides with said second bit data to generate a judged result;

(d) detecting, as fail data, said first bit data which does not coincide with said second bit data, based on said judged result to generate a detected result;

(e) writing, as at least a part of a write operation, said second bit data to each of said plurality of memory cells based on said detected result, wherein said write operation is performed with one cycle or a plurality of cycles; and (f) determining a number of said cycles included in said write operation when said (e) step is performed, based on said detected result.

12. A program verification method according to claim 11, wherein said (a) step includes reading out said first bit data from each of said plurality of memory cells to form a read out data of N (N is a positive integer) bits; and said (f) step includes detecting a distribution of said fail data in said read out data as a second detected result based on said detected result to determine said number of cycles based on said second detected result.

13. A program verification method according to claim 11, further comprising:

(g) setting as M (M is a positive integer) a number of said second bit data which can be written in said one cycle when said write operation of said (e) step is performed, wherein said (a) step includes reading out said first bit data from said each memory cell to form a read out data of N (N is a positive integer) bits, and wherein said (f) step further comprising:

(h) judging whether or not a number of said fail data exceeds (said M+1), of all of said read out data of said N bits, based on said detected result, and wherein said (f) step includes determining said number of cycles to be one, when said number of fail data does not exceed said (M+1), as the judged result of said (h) step.

14. A program verification method according to claim 13, wherein said (f) step further comprising:

(i) setting at least two judgment portions, in which each portion corresponds to P said first bit data to said read out data, wherein said P is equal to two times said M; and (j) judging whether or not there are said fail data of said (M+1) or more in each of first and second said judgment portions, based on said detected result, and wherein said (f) step includes determining said number of cycles to be two, when it is judged that there are said fail data of said (M+1) or more, as said judged result of said (h) step, and when it is judged that there are not said fail data of said (M+1) or more in both of said first and second judgment portions, as the judged result of said (j) step.

15. A program verification method according to claim 14, wherein said (f) step further comprising:

(k) judging whether or not said fail data in each of said first and second judgment portions is zero, based on said detected result, and wherein said (f) step includes determining said number of cycles to be two, when it is judged that there are said fail data of said (M+1) or more in said first judgment portion, as said judged result of said (j) step, and when it is judged that said fail data in said second judgment portion is zero, as the judged result of said (k) step, and determining said number of cycles to be three, when it is judged that there are said fail data of said (M+1) or more in said first judgment portion and there are not said fail data of said (M+1) or more in said second judgment portion, as said judged result of said (j) step, and when it is judged that said fail data in said second judgment portion is not zero, as said judged result of said (k) step.

16. A program verification method according to claim 11, wherein said (e) step includes writing said second bit data to each of said plurality of memory cells corresponding to said detected fail data.

17. A program verification method according to claim 11, wherein said (a) step includes reading out said first bit data from said each memory cell to form a read out data of N (N is a positive integer) bits, and wherein said program verification method further comprising:

(l) setting as M (M is a positive integer) a number of said second bit data which can be written in said one cycle when said write operation of said (e) step is performed; and (m) providing a plurality of write sections, wherein a number of said plurality of write sections is said N, and each of said N write sections writes said second bit data to said each memory cell, and wherein said (m) step includes providing said N write sections such that said N write sections are classified into a plurality of groups, each of said plurality of groups being allocated to said M write sections, and wherein said program verification method further comprising:

(n) inputting a first control signal for determining a write timing to each of said M write sections allocated to a first one of said plurality of groups, wherein said first control signal is common in said M write sections of said first group.

18. A program verification method according to claim 17, further comprising:

(o) inputting a judgment signal indicating that said each memory cell corresponding to each of said M write sections of said first group has said fail data, in addition to said first control signal, to said each write section of said first group, and wherein said each write section of said first group writes said second bit data, in response to said first control signal and said judgment signal.

19. A program verification method according to claim 17, further comprising:

(p) inputting a second control signal for determining a write timing to each of said M write sections of a second one of said plurality of groups, wherein said second control signal is common in said M write sections of said second group, and wherein said (p) step includes inputting said second control signal to said each write section of said second group at one of a timing identical to said first control signal and a timing different from said first control signal, based on said detected result.

20. A program verification method according to claim 17, further comprising:

(q) determining whether or not a second control signal common in a second one of said plurality of groups is inputted to each of said M write sections of said second group, based on said detected result.

21. A program verification method of a nonvolatile semiconductor memory comprising:

(a) providing a memory cell array including a plurality of nonvolatile memory cells;

(b) reading out a read out data including first bit data of N (N is a positive integer) bits from said memory cell array;

(c) providing an expectation value data including second bit data of said N bits;

(d) comparing said first bit data with said second bit data in units of bits to output a plurality of judgment signals indicative of the respective compared results, wherein a number of said plurality of judgment signals is said N;

(e) providing a plurality of write circuits to write each of said second bit data of said N bits respectively in response to a control signal, wherein a number of said plurality of write circuits is said N; and (f) outputting said control signal to each of said N write circuits, in response to said plurality of judgment signals, wherein said (f) step includes determining a number of said plurality of write circuits to which said control signal is simultaneously outputted, based on said plurality of judgment signals, and outputting said control signal simultaneously to said plurality of write circuits corresponding to said determined number.

22. A program verification method according to claim 21, wherein said (f) step includes detecting, as fail data, said first bit data which does not coincide with said second bit data based on said plurality of judgment signals, and detecting, as second detected result, a distribution of said fail data in said read out data to determine said number based on said second detected result.

* * * * *